(12) United States Patent
Yang

(10) Patent No.: US 10,916,503 B2
(45) Date of Patent: Feb. 9, 2021

(54) BACK END OF LINE METALLIZATION STRUCTURE

(71) Applicant: INTERNATIONAL BUSINESS MACHINES CORPORATION, Armonk, NY (US)

(72) Inventor: Chih-Chao Yang, Glenmont, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 115 days.

(21) Appl. No.: 16/127,584

(22) Filed: Sep. 11, 2018

(65) Prior Publication Data

US 2020/0083174 A1  Mar. 12, 2020

(51) Int. Cl.
*H01L 21/768*   (2006.01)
*H01L 23/532*   (2006.01)

(52) U.S. Cl.
CPC .... *H01L 23/53238* (2013.01); *H01L 21/7684* (2013.01); *H01L 21/76807* (2013.01); *H01L 23/53233* (2013.01)

(58) Field of Classification Search
CPC ........... H01L 21/76807; H01L 21/7684; H01L 21/76841; H01L 21/76843; H01L 21/76826; H01L 21/768; H01L 21/76822; H01L 21/76828
See application file for complete search history.

(56) References Cited

U.S. PATENT DOCUMENTS

| 6,174,812 | B1 | 1/2001 | Hsiung et al. |
| 6,191,023 | B1 | 2/2001 | Chen |
| 6,204,204 | B1 | 3/2001 | Paranjpe et al. |
| 6,251,806 | B1 | 6/2001 | Chang et al. |
| 6,303,459 | B1 | 10/2001 | Chen |
| 6,342,448 | B1 | 1/2002 | Lin et al. |
| 6,350,667 | B1 | 2/2002 | Chen et al. |
| 6,383,943 | B1 | 5/2002 | Chen et al. |
| 6,437,440 | B1 | 8/2002 | Cabral, Jr. et al. |
| 6,475,902 | B1 | 11/2002 | Hausmann et al. |
| 6,491,978 | B1 | 12/2002 | Kalyanam |
| 6,528,180 | B1 | 3/2003 | Lee et al. |
| 6,680,538 | B2 | 1/2004 | Kim et al. |
| 6,736,701 | B1 | 5/2004 | Shue et al. |
| 6,783,868 | B2 | 8/2004 | Ciotti et al. |
| 6,900,539 | B2 | 5/2005 | Motoyama |
| 6,909,188 | B2 | 6/2005 | Akiyama |

(Continued)

OTHER PUBLICATIONS

J. A. Wilks et al., "Nitridation of organo-silicate glass: A self-limiting process for PVD Ta1+ xN/Ta barrier formation," Applied Surface Science, vol. 255, No. 23, 2009, pp. 9543-9547.

*Primary Examiner* — Thanhha S Pham
(74) *Attorney, Agent, or Firm* — Cantor Colburn LLP; James Nock

(57) ABSTRACT

Back end of line metallization structures and processes of fabricating the metallization structures generally patterning a dielectric layer formed of SiC, SiN or SiC (N, H) and filled the openings in the patterned dielectric layer with a metal conductor. Optionally, the surfaces defining the openings of the dielectric layer are subjected to a nitridation process to form a nitride layer at the surface. Still further, the metallization structures can include a pure metal liner on the surfaces defining the openings of the dielectric layer.

7 Claims, 3 Drawing Sheets

(56) References Cited

U.S. PATENT DOCUMENTS

| | | |
|---|---|---|
| 6,910,947 B2 | 6/2005 | Paik |
| 6,984,198 B2 | 1/2006 | Krishnamurthy et al. |
| 6,999,836 B2 | 2/2006 | Schwarm et al. |
| 7,026,721 B2 | 4/2006 | Chen |
| 7,040,956 B2 | 5/2006 | Paik |
| 7,069,101 B1 | 6/2006 | Arackaparambil et al. |
| 7,078,810 B2 | 7/2006 | Wang et al. |
| 7,082,345 B2 | 7/2006 | Shanmugasundram et al. |
| 7,096,085 B2 | 8/2006 | Paik |
| 7,101,799 B2 | 9/2006 | Paik |
| 7,151,315 B2 | 12/2006 | Wu et al. |
| 7,160,739 B2 | 1/2007 | Shanmugasundram et al. |
| 7,174,230 B2 | 2/2007 | Arackaparambil et al. |
| 7,188,142 B2 | 3/2007 | Chi et al. |
| 7,201,936 B2 | 4/2007 | Schwarm et al. |
| 7,205,228 B2 | 4/2007 | Padhi et al. |
| 7,221,990 B2 | 5/2007 | Paik |
| 7,225,047 B2 | 5/2007 | Al-Bayati et al. |
| 7,272,459 B2 | 9/2007 | Kokotov et al. |
| 7,333,871 B2 | 2/2008 | Schwarm |
| 7,337,019 B2 | 2/2008 | Reiss et al. |
| 7,349,753 B2 | 3/2008 | Paik |
| 7,354,332 B2 | 4/2008 | Surana et al. |
| 7,356,377 B2 | 4/2008 | Schwarm |
| 7,358,589 B1 | 4/2008 | Hawley et al. |
| 7,390,726 B1 | 6/2008 | Issaq et al. |
| 7,393,722 B1 | 7/2008 | Issaq et al. |
| 7,405,151 B2 | 7/2008 | Wang et al. |
| 7,459,763 B1 | 12/2008 | Issaq et al. |
| 7,535,066 B2 | 5/2009 | Rotondaro et al. |
| 7,611,912 B2 | 11/2009 | Hong et al. |
| 7,698,012 B2 | 4/2010 | Shanmugasundram et al. |
| 7,700,474 B2 | 4/2010 | Cerio, Jr. |
| 8,420,531 B2 | 4/2013 | Yang et al. |
| 9,716,063 B1 | 7/2017 | Edelstein et al. |
| 9,721,895 B1 * | 8/2017 | Yang ................ H01L 21/76826 |
| 2013/0333923 A1 | 12/2013 | Balseanu et al. |
| 2016/0049328 A1 * | 2/2016 | Zhou ................ H01L 21/76826 |
| | | 257/751 |
| 2017/0117179 A1 * | 4/2017 | Koschinsky ...... H01L 21/76862 |
| 2017/0271512 A1 | 9/2017 | Adusumilli et al. |

* cited by examiner

BACK END OF LINE METALLIZATION STRUCTURE

BACKGROUND

The present invention generally relates to semiconductor integrated circuits, and more particularly, to the structure and formation of back end of line metallization structures.

Integrated circuit processing can be generally divided into front end of the line (FEOL), middle of the line (MOL) and back end of the line (BEOL) processes. The FEOL and MOL processing will generally form many layers of logical and functional devices. By way of example, the typical FEOL processes include wafer preparation, isolation, well formation, gate patterning, spacer, extension and source/drain implantation, silicide formation, and dual stress liner formation. The MOL is mainly gate contact (CA) formation. Layers of interconnections are formed above these logical and functional layers during the BEOL processing to complete the integrated circuit structure. As such, BEOL processing generally involves the formation of insulators and conductive wiring.

SUMMARY

Embodiments of the present invention are generally directed to semiconductor structures including a back end of line metallization structure and methods of fabrication. A non-limiting example of a back end of line metallization structure according to aspects of the invention includes a patterned dielectric layer including one or more openings. The patterned dielectric layer includes SiC, SiN or SiC (N,H). A bulk metal is disposed in the one or more openings, wherein the bulk metal has an upper surface coplanar to an upper surface of the dielectric layer, wherein the bulk metal is free of a metal nitride liner layer.

A non-limiting example of the semiconductor structure according to aspects of the invention includes a back end of line metallization structure consisting of a patterned dielectric layer including one or more openings. The patterned dielectric layer includes SiC, SiN or SiC (N,H). A bulk metal is disposed in the one or more openings to form the back end of line metallization structure. The bulk metal has an upper surface coplanar to an upper surface of the dielectric layer, wherein the back end of the line metallization structure is free of any liner layer.

A non-limiting example of a back end of the line process for forming a metallization structure layer according to aspects of the invention includes depositing a dielectric layer onto a surface, wherein the dielectric layer includes SiC, SiN or SiC (N,H). The dielectric layer is lithographically patterned and etched to form one or more openings. A metal is deposited into the one or more openings. The surface is planarized to remove an excess of the metal such that the uppermost surfaces of the metal and the dielectric layer are coplanar to each other.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION

Figure 1:
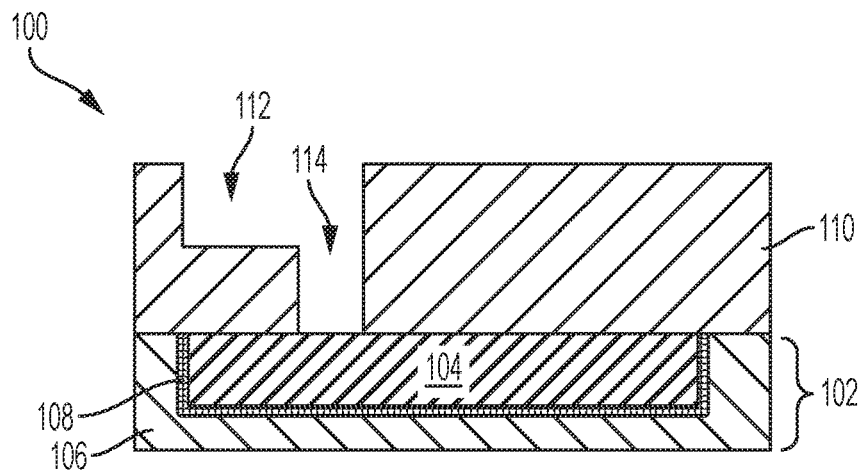
FIG. 1 depicts a cross section of an integrated circuit including a first metallization structure and a patterned dielectric layer formed on the first metallization structure in accordance with one or more embodiments of the present invention.

The present invention generally relates to back end of line (BEOL) metallization structures and processes for forming the metallization structures. The structures and processes generally include replacing the conventional silicon oxide dielectric layer with a dielectric layer formed of silicon nitride, silicon carbide or nitrogen doped silicon carbide or combinations thereof. Subsequent to patterning the dielectric layer, the dielectric surface is subjected to a nitridation process to form a nitride dielectric surface. Advantageously, the metallization structure and processes for forming the metallization structure are free of a liner layer (e.g., tantalum nitride) when depositing the metal conductor such as copper. Instead, a pure metal conductive liner/seed layer can be conformally deposited in the patterned dielectric layer prior to deposition of the metal conductor in the structure.

Detailed embodiments of the integrated circuit including at least one metallization layer and methods for fabricating an integrated circuit including the at least one metallization layer according to aspects of the present invention will now be described herein. However, it is to be understood that the embodiments of the invention described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description. For the purposes of the description hereinafter, the terms "upper", "lower", "top", "bottom", "left," and "right," and derivatives thereof shall relate to the described structures, as they are oriented in the drawing figures. The same numbers in the various figures can refer to the same structural component or part thereof.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

Conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

It is to be understood that the various layers and/or regions shown in the accompanying drawings are not drawn to scale, and that one or more layers and/or regions of a type commonly used in complementary metal-oxide semiconductor (CMOS) fabrication techniques, fin field-effect transistor (FinFET) devices, metal-oxide-semiconductor field-effect transistor (MOSFET) devices, and/or other semiconductor fabrication techniques and devices, may or may not be explicitly shown in a given drawing. This does not imply that the layers and/or regions not explicitly shown are omitted from the actual devices. In addition, certain elements could be left out of particular views for the sake of clarity and/or simplicity when explanations are not necessarily focused on the omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices and methods for forming same in accordance with embodiments of the present invention can be employed in applications, hardware, and/or electronic systems. Suitable hardware and systems for implementing embodiments of the invention can include, but are not limited to, personal computers, communication networks, electronic commerce systems, portable communications devices (e.g., cell and smart phones), solid-state media storage devices, functional circuitry, etc. Systems and hardware incorporating the semiconductor devices are contemplated embodiments of the invention. Given the teachings of embodiments of the invention provided herein, one of ordinary skill in the art will be able to contemplate other implementations and applications of embodiments of the invention.

The embodiments of the present invention can be used in connection with semiconductor devices that could require, for example, CMOSs, MOSFETs, and/or FinFETs. By way of non-limiting example, the semiconductor devices can include, but are not limited to CMOS, MOSFET, and FinFET devices, and/or semiconductor devices that use CMOS, MOSFET, and/or FinFET technology.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

As used herein, the terms "about," "substantially," and equivalents thereof, modifying the quantity of an ingredient, component, or reactant of the invention employed refers to variation in the numerical quantity that can occur, for example, through typical measuring and liquid handling procedures used for making concentrates or solutions. Furthermore, variation can occur from inadvertent error in measuring procedures, differences in the manufacture, source, or purity of the ingredients employed to make the compositions or carry out the methods, and the like. In one aspect, the term "about" means within 10% of the reported numerical value. In another aspect, the term "about" means within 5% of the reported numerical value. Yet, in another aspect, the term "about" means within 10, 9, 8, 7, 6, 5, 4, 3, 2, or 1% of the reported numerical value.

It will also be understood that when an element, such as a layer, region, or substrate is referred to as being "on" or "over" another element, it can be directly on the other element or intervening elements can also be present. In contrast, when an element is referred to as being "directly on" or "directly over" another element, there are no intervening elements present, and the element is in contact with another element.

As used herein, the term "substrate" can include a semiconductor wafer, such as a type IV semiconductor wafer, e.g., silicon wafer, or a type III-V semiconductor wafer, such as a compound semiconductor, e.g., gallium arsenide semiconductor wafer. In one or more embodiments, a number of dielectric layers and semiconductor material layers can be arranged with the substrate to provide microelectronic devices, or smaller devices, which can include semiconductor devices, such as field effect transistors (FETs), fin type field effect transistors (FinFETs), bipolar junction transistors (BJT) and combinations thereof. The at least one device layer can also include memory devices, such as dynamic random access memory (DRAM), embedded dynamic random access memory (EDRAM), flash memory and combinations thereof. The at least one device layer can also include passive devices, such as resistors and capacitors, as well as electrical connections to the devices containing within the at least one device layer.

It should also be noted that not all masking, patterning, and lithography processes are shown, because a person of ordinary skill in the art would recognize where masking and patterning are utilized to form the identified layers and openings, and to perform the identified selective etching processes, as described herein.

Turning now to FIGS. 1-5, schematically illustrated is a structure and process flow for forming an integrated circuit including at least one metallization layer according to one or more embodiments of the invention.

In FIG. 1, there is shown a portion of an integrated circuit 100 including a first metallization structure, i.e., first interconnect structure 102 and a patterned dielectric layer 110 formed on the first metallization structure 102 The first metallization structure 102 includes metal conductor 104 and an interlayer dielectric 106. The patterned dielectric layer is in accordance with one or more aspects of the present invention and is formed of a silicon nitride, silicon carbide, or a silicon carbide (N, H).

The first metallization structure 102 is a conventional metallization structure, wherein the interlayer dielectric 106 is lithographically patterned and etched to form one or more openings that will define the metal interconnect. The interlayer dielectric 106 of the first metallization structure 102 can be any dielectric material including inorganic dielectrics or organic dielectrics. The dielectric material can be porous or non-porous. Some examples of suitable dielectrics that can be used as the dielectric material include, but are not limited to: $SiO_2$, silsesquioxanes, carbon doped oxides (i.e., organosilicates) that include atoms of Si, C, O and H, thermosetting polyarylene ethers, or multilayers thereof. The term "polyarylene" is used to denote aryl moieties or inertly substituted aryl moieties which are linked together by bonds, fused rings, or inert linking groups such as, for example, oxygen, sulfur, sulfone, sulfoxide, carbonyl and the like. The interlayer dielectric 102 can be deposited by PECVD procedures as is generally known in the art. Typically, the dielectric layer is silicon dioxide.

A liner layer 108 (i.e., diffusion barrier layer) is then conformally deposited onto the patterned interlayer dielectric 106. A typical liner layer can include tantalum, tantalum nitride, cobalt, ruthenium, titanium, titanium nitride, tungsten nitride, or combinations of more than one material (for example tantalum nitride/tantalum or tantalum nitride/cobalt). The presence of the liner layer such as titanium nitride, for example, insures that a metal such copper, which can participate in interdiffusion during subsequent annealing processes, to fabricate the integrated circuit 100 will not further diffuse into interlayer dielectric. The liner layer 106 can be deposited by PVD, CVD, or ALD processes.

Next, an optional conformal seed layer (not shown) is deposited. The function of the seed layer is to provide a base upon which a metal conductor can be deposited. The seed layer can be formed by one or more methods known to those skilled in the art. For example, the seed layer can be formed by chemical vapor deposition (CVD), physical vapor deposition (PVD), or some variation of these two deposition processes. The seed layer can also be formed electrochemically or by an electroless process. In the case of PVD, the seed layer can be deposited by reactive or non-reactive sputtering from a single alloy target, or from multiple targets, by ionized sputtering.

The composition of the one or metals in the deposited seed layer is typically from 1 atomic percent to about 10 atomic percent. In some embodiments, the deposited seed layer will contain from about 1 atomic percent to about 7 atomic percent. Examples of seed layers are copper, copper manganese, and the like.

Following deposition of the seed layer, a layer of metal is then deposited, which will be used to define the metal conductor 104. The metal can be copper, but can be any suitable conductor including, but not limited to Cu, Co, Al, AlCu, Ti, TiN, Ta, TaN, W, WN, MoN, Pt, Pd, Os, Ru, $IrO_2$, $ReO_2$, $ReO_3$, alloys thereof, and mixtures thereof. In some structures, the copper metal layer can be used and can include an alloying element such as C, N, O, Cl or S, which have been shown to improve the reliability of the copper conductor. The amount of alloying element in the copper alloy is typically in the range of about 0.001 weight percent (wt. %) to about 10 wt %).

The metal layer can be formed by CVD, sputtering, electrochemical deposition or like processes. For example, the deposition of copper can proceed by electrochemical deposition such as electroplating or electroless plating.

Following formation of the metal layer, the substrate is subjected to a planarization process to remove any metal overburden (includes seed layer and liner layer removal) such that a top surface of the metal conductor 104 is substantially coplanar to the dielectric layer 106 as shown. For example, the surface can be planarized using an electropolishing process. In an electropolishing process, small amounts of metal are etched by electroetch or electrochemical etching to provide a metal interconnect having a top metal surface generally coplanar to the top surface of the dielectric. In another embodiment, the planar surface is formed by chemical mechanical polishing (CMP). The CMP process planarizes the surface of the interconnect structure by a combination of chemical and mechanical forces using a non-selective slurry composition generally known in the art. The slurry composition contains a silica abrasive material, which removes the different metal layers at substantially the same rate. Alternatively, a planar surface can be formed by a non-selective plasma etching process. The plasma etching process can include additional planarizing layers deposited onto metal layer. For example, a layer of photoresist can be deposited onto metal layer prior to performing the non-selective etch process.

Following formation of the first metallization structure 102, the dielectric layer 110 is deposited onto the planar surface of the first interconnect structure 102. As noted above, the dielectric layer 110 is formed of a silicon nitride (SiN), silicon carbide (SiC), or a nitrogen doped silicon carbide (SiC (N, H)). The dielectric layer 106 is lithographically patterned and etched to form an opening. An exemplary process is a dual damascene process, which is characterized by patterning the vias and trenches, in such a way that subsequent metal deposition fills both at the same time.

Figure 2:
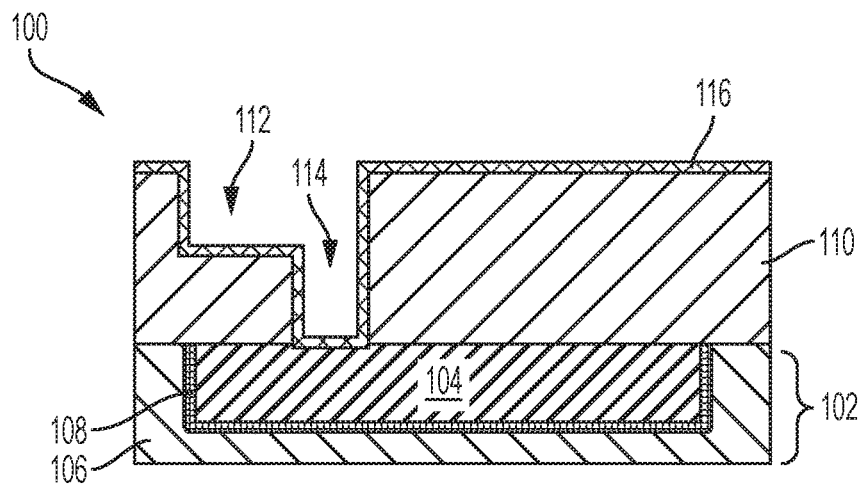
FIG. 2 depicts a cross section of integrated circuit FIG. 1 subsequent to nitridation of the patterned dielectric layer in accordance with one or more embodiments of the present invention.

In FIG. 2, the interlayer dielectric 110 is subjected to a nitridation process. In this step, the surfaces of the dielectric layer 110 including the trench and via 112, 114, respectively, are exposed to nitrogen ions generated from a nitrogen-containing gas to form a nitrogen enriched dielectric layer 116 at the surface of the dielectric layer 110. The generation of the nitrogen ions can be plasma or thermally generated, wherein the nitrogen ions penetrate into at least a portion of the dielectric layer surface 110.

As defined herein, the nitrogen-containing gas is selected from the group consisting of nitrogen ($N_2$) and ammonia ($NH_3$). Upon exposure to a suitable energy source, the nitrogen or ammonia dissociates to form nitrogen ions, which are then utilized to enrich a contact surface such as the exposed surfaces of the dielectric layer with nitrogen ions.

Suitable energy sources include, but are not limited to, plasma energy sources and thermal energy sources.

Plasma nitridation generally includes exposing the nitrogen-containing gas to a plasma energy source effective to generate the nitrogen ions from the nitrogen containing gas. The substrate including the exposed dielectric layer surfaces of the trench and via are then exposed to the nitrogen ions to form a nitrogen enriched surface that also penetrates the respective surface to form a nitrogen enriched gradient in the dielectric layer. The process temperature is between 80 to 400° C., and the bias is typically between 100 to 900 W.

Thermal nitridation provides a similar effect as plasma nitridation but generally includes exposing the substrate to a temperature effective to generate nitrogen ions from the nitrogen containing gas. Again, the nitrogen ions contact and penetrate the exposed surface of the dielectric layer so as to form a nitrogen enriched gradient in the dielectric layer. The process temperature is generally between 200 to 400° C.

Figure 3:
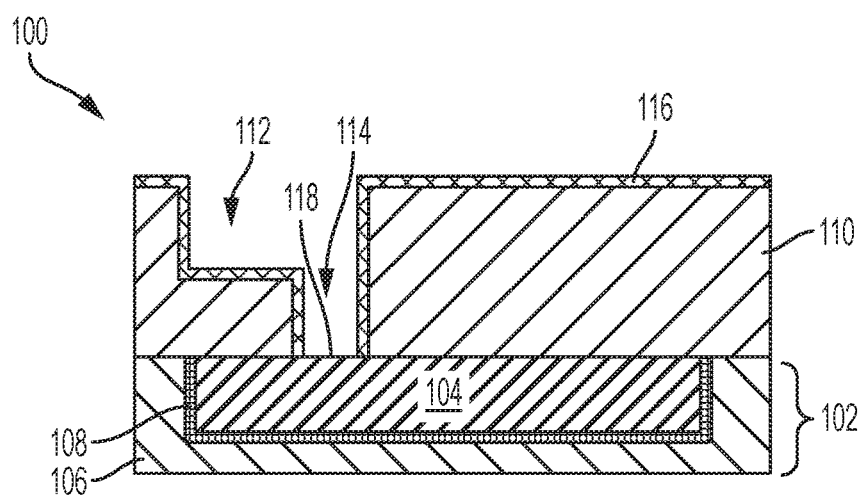
FIG. 3 depicts a cross section of the structure of FIG. 2 subsequent to a cleaning process to clean an exposed metal conductor surface in the first metallization structure in accordance with one or more embodiments of the present invention.

In FIG. 3, a pre-clean process such as a plasma treatment is then performed to clean the exposed metal conductor of the first interconnect 102 at the bottom 118 of the via of contaminants, oxides, nitrides, or the like. The process gases preferably include, but are not limited to, $H_2$, forming gas, $O_2$ and combinations thereof and a carrier gas. The carrier gases preferably include inert gases, He, Ne, Ar, Kr, Xe and Rn, and combinations thereof. The process conditions preferably include a temperature of between about room temperature and about 450° C., a pressure of between about 0.5 mtorr and about 100 torr, an RF power of between about 50 W and about 5 KW, and a process time of between about 5 seconds and about 600 seconds. Alternatively, a wet clean process can be used including, but not limited to a reduced particle cleaning process (RPC), air pollution control processes (APC) or other chemical/physical cleaning processes typically used in the microelectronics fabrication facility.

Figure 4:
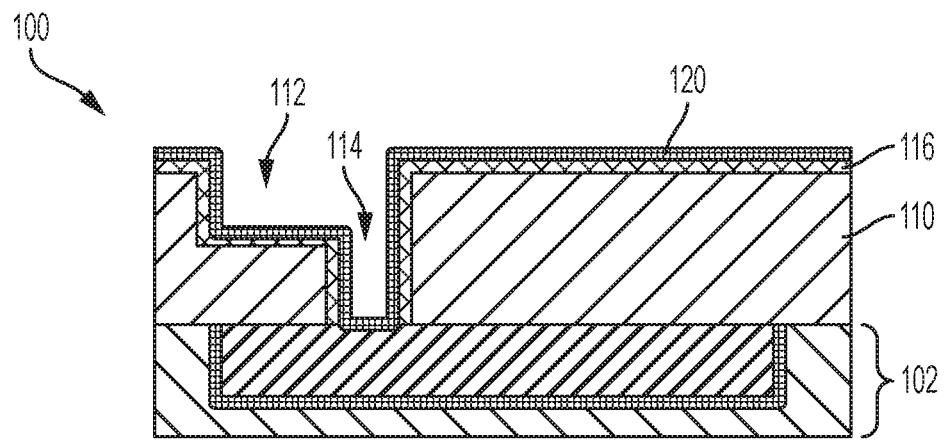
FIG. 4 depicts a cross section of the structure of FIG. 3 subsequent to conformal deposition of a liner layer formed of a pure metal free of nitrides in accordance with one or more embodiments of the present invention.

In FIG. 4, a liner 120 of pure conductive metal can be conformally deposited. Suitable metals include tantalum, cobalt, ruthenium, iridium, rhodium, nickel, gold, aluminum, tungsten, or the like. Metal nitrides are specifically not utilized in the current application. Followed by an optional seeding layer deposition, e.g., Cu, Cu alloy (Not shown in the figure).

Figure 5:
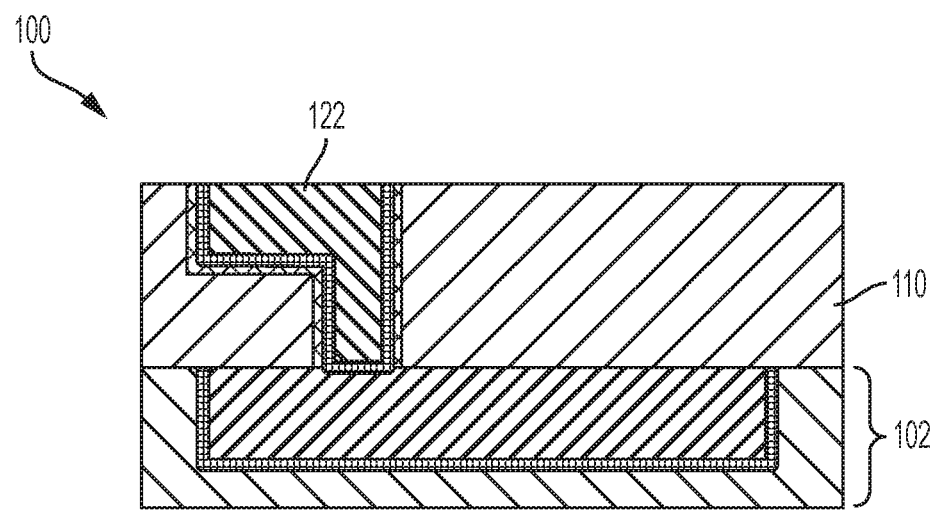
FIG. 5 depicts a cross section of the structure of FIG. 4 subsequent to deposition of a bulk metal in accordance with one or more embodiments of the present invention.

In FIG. 5, a layer of metal is then deposited, filling the trench and via openings in the dielectric layer 110, which will be used to define the metal conductor 122. The metal can be copper, but can be any suitable conductor including, but not limited to Cu, Co, Al, AlCu, Ti, TiN, Ta, TaN, W, WN, MoN, Pt, Pd, Os, Ru, $IrO_2$, $ReO_2$, $ReO_3$, alloys thereof, and mixtures thereof. In some structures, the copper metal layer can be used and can include an alloying element such as C, N, O, Cl or S, which have been shown to improve the reliability of the copper conductor. The amount of alloying element in the copper alloy is typically in the range of about 0.001 weight percent (wt. %) to about 10 wt %).

The metal layer can be formed by CVD, sputtering, electrochemical deposition or like processes. For example, the deposition of copper can proceed by electrochemical deposition such as electroplating or electroless plating.

Following formation of the metal layer, the substrate is subjected to a planarization process as previously described to remove any metal overburden (including seed layer and liner layer removal) such that a top surface of the metal conductor 122 is substantially coplanar to the dielectric layer 110 as shown. The resulting interconnect structure overlying and electrically coupled to the first metallization structure 102 includes a nitrogen enriched dielectric layer 116 and a dielectric layer formed of SiC, SiN, and SiC (N, H), which functions as a barrier layer. Moreover, no metal oxide or metal nitride is present at an interface with the metal conductor 104 of the first metallization structure 102.

Figure 6:
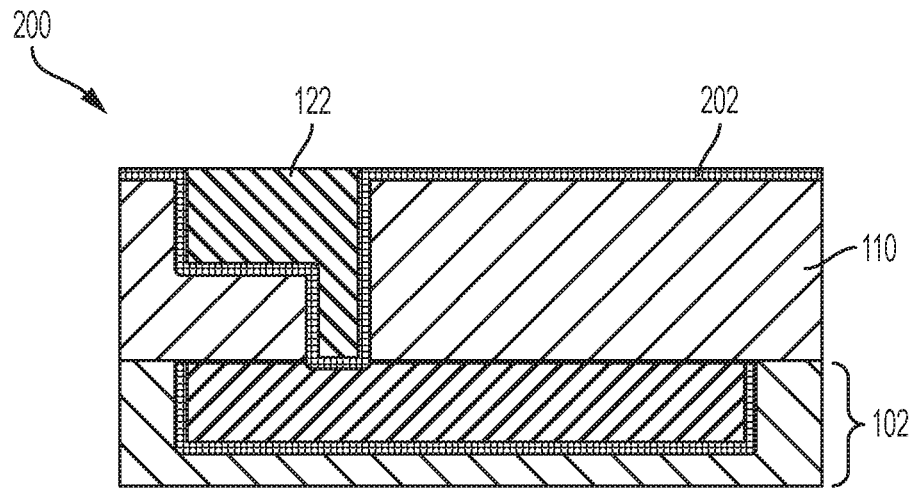
FIG. 6 depicts a cross section of the structure of FIG. 5 without a nitrogen enriched dielectric layer in accordance with one or more embodiments of the present invention.

FIG. 6 depicts a cross section of a portion of an integrated circuit 200 in accordance with one or more embodiments of the present invention, wherein the integrated circuit 200 is free of the nitrogen enriched dielectric layer as described above (e.g., nitrogen enriched dielectric layer 116 in FIG. 4). The integrated circuit 200 including the first metallization structure 102 and the patterned dielectric layer 110 as previously described. The pure metal liner layer/seed layer 202 is conformally deposited onto the surface of the patterned dielectric layer 110. The dielectric layer 110 is not subjected to a nitridation process prior to depositing the liner layer 202. The process as described in relation to FIG. 5 is utilized to complete the interconnect structure, i.e., fill the openings in the dielectric layer 110 with a metal 122 followed by planarization to remove the pure metal liner form the uppermost surfaces of the dielectric layer 110. Again, because the dielectric layer 110 is formed of SiN, SiC, or SiC(N,H), the interdiffusion of the metal conductor during subsequent processing steps does not occur.

Figure 7:
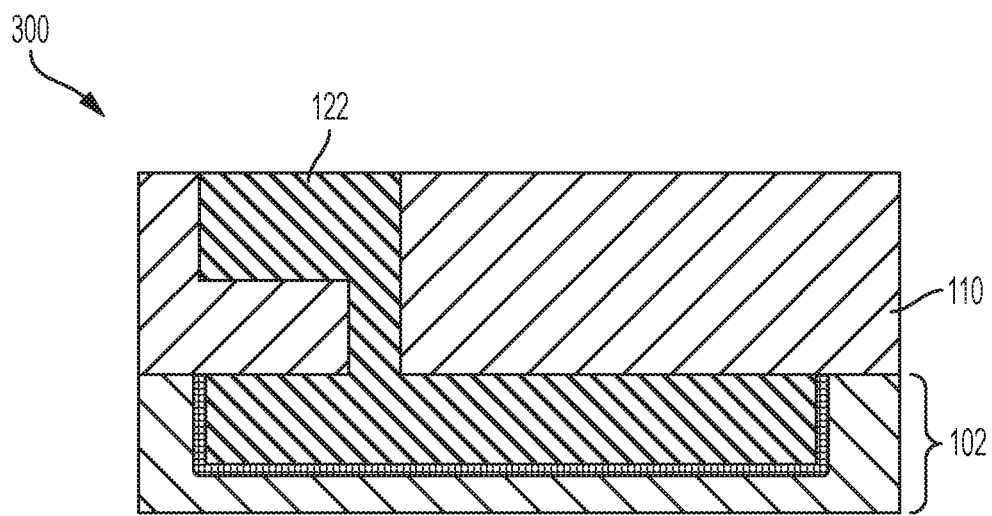
FIG. 7 depicts a cross section of the structure of FIG. 5 without a nitrogen enriched dielectric layer and a liner layer in accordance with one or more embodiments of the present invention.

FIG. 7 depicts a cross section of a portion of an integrated circuit 300 in accordance with one or more embodiments of the present invention wherein the integrated circuit 300 is free of the nitrogen enriched dielectric layer and the liner layer as described above (e.g., nitrogen enriched dielectric layer 116 and liner layer 102 in FIG. 4). The integrated circuit 300 including the first metallization structure 102 and the patterned dielectric layer 110 as previously described. The metal 122 is deposited directly onto the dielectric filling the openings followed by a planarization process. As such, the resulting metallization structure is free of a liner and nitridation of the dielectric layer surface 110, i.e., the process excludes the steps presented in FIGS. 2 and 4 above. Again, because the dielectric layer 110 is formed of SiN, SiC, or SiC (N,H), the interdiffusion of the metal conductor during subsequent processing steps does not occur even in the absence of the liner layer and the nitrided surface.

The descriptions of the various embodiments of the present invention have been presented for purposes of illustration, but are not intended to be exhaustive or limited to the embodiments of the invention described. Many modifications and variations will be apparent to those of ordinary skill in the art without departing from the scope and spirit of the described embodiments of the invention. The terminology used herein was chosen to best explain the principles of the embodiments of the invention, the practical application or technical improvement over technologies found in the marketplace, or to enable others of ordinary skill in the art to understand the embodiments of the invention described herein.

What is claimed is:

1. A back end of the line process for forming a metallization structure layer, the process comprising:
    depositing a dielectric layer onto a surface of an interconnect structure comprising a metal conductor, wherein the dielectric layer comprises SiC, SiN or SiC (N,H);
    lithographically patterning and etching the dielectric layer to form one or more openings exposing a surface of the metal conductor;
    forming a nitrogen enriched layer by exposing the dielectric layer to a nitridation process, wherein the nitridation process comprises generating nitrogen ions from a nitrogen containing gas;

removing a portion of the nitrogen enriched layer to expose a surface of the metal conductor;

conformally depositing a pure metal liner layer free of nitrides into the one or more openings;

depositing a metal into the one or more openings directly on a surface of the pure metal liner layer; and planarizing a surface to remove an excess of the metal such that uppermost surfaces of the metal and the dielectric layer are coplanar to each other.

2. The process of claim 1, wherein the nitrogen containing gas is selected from the group consisting of nitrogen (N2) and ammonia (NH3).

3. The process of claim 2, wherein generating the nitrogen ions from the nitrogen containing gas comprises exposing the nitrogen containing gas to an energy source effective to generate the nitrogen ions from the nitrogen containing gas.

4. The process of claim 3, wherein the energy source is a plasma energy source.

5. The process of claim 3, wherein the energy source is thermal energy source.

6. The process of claim 1, wherein the pure metal liner layer comprises tantalum, cobalt, ruthenium, iridium, rhodium, nickel, gold, aluminum, tungsten and combinations of at least one of the foregoing.

7. The process of claim 1, wherein the metal comprises copper.

\* \* \* \* \*